United States Patent [19]
Gillenwater et al.

[11] Patent Number: 5,546,406
[45] Date of Patent: Aug. 13, 1996

[54] CELL ARCHITECTURE FOR BUILT-IN SELF-TEST OF APPLICATION SPECIFIC INTEGRATED CIRCUITS

[75] Inventors: Russell L. Gillenwater; Davoud Safari, both of Round Rock; Gary D. Owens, Austin, all of Tex.

[73] Assignee: Tandem Computers, Inc., Cupertino, Calif.

[21] Appl. No.: 507,737

[22] Filed: Jul. 26, 1995

Related U.S. Application Data

[63] Continuation of Ser. No. 905,973, Jun. 29, 1992, abandoned.
[51] Int. Cl.$^6$ ............................ G01R 31/28; H04B 17/00
[52] U.S. Cl. ...................... 371/22.5; 371/22.3; 371/22.6
[58] Field of Search ................................. 371/22.1, 22.2, 371/22.3, 22.5, 22.6, 15.1, 16.1

[56] References Cited

U.S. PATENT DOCUMENTS 5,260,948  11/1993  Simpson et al. ..................... 371/22.3
5,347,520   9/1994  Simpson et al. ..................... 371/22.3

*Primary Examiner*—Emanuel T. Voeltz
*Assistant Examiner*—Edward Pipala
*Attorney, Agent, or Firm*—Graham & James LLP

[57] ABSTRACT

An application specific integrated circuit (ASIC) includes ASIC logic, test logic, dual function input test cells and dual function output test cells. The test logic with the input and output test cells provides manufacturing test capability for the ASIC logic with a plurality of input pins and a plurality of output pins while reducing both the gate count and signal time delay associated with the input and output test cells. Each input test cell includes a boundary scan circuit means and a built-in self-test circuit means. An input test cell has a signal propagation time delay for a signal, that travels from an input pin to an ASIC logic input line, equivalent to one two-to-one multiplexer signal propagation delay. Hence, while the input test cell has the capability of both built-in self-test and boundary scan testing, the dual capability is achieved without incurring a signal propagation time delay for each capability. Like the input test cells, each output test cell includes a boundary scan circuit means and a built-in self-test circuit means. The output test cell also has a signal propagation time delay for a signal, that travels from an ASIC logic output line to an output pin, equivalent to a single two-to-one multiplexer signal propagation delay.

25 Claims, 14 Drawing Sheets

| INSTRUCTION | INSTRUCTION REGISTER BITS | | | | | |
|---|---|---|---|---|---|---|
| | b15..b12 | b11..b8 | b7..b4 | b3.b2 | b1 | b0 |
| EXTEST | 0000 | 0000 | 0000 | 00 | 0 | 0 |
| INTEST | 0111 | XXXX | XXXX | 00 | X | X |
| SAMPLE/PRELOAD | 0101 | XXXX | XXXX | 00 | X | X |
| BYPASS | 1111 | 1111 | 1111 | 11 | 1 | 1 |
| IDREG | 1000 | XXXX | XXXX | 00 | X | X |
| RO | 1110 | XXXX | XXXX | 00 | X | X |
| BSBIST (sample) | 1101 | XXXX | 0001 | 00 | X | X |
| BSBIST (run) | 1101 | XXXX | 0010 | 00 | X | X |
| ISCAN (load) | 0100 | XXXX | 0001 | 00 | X | X |
| ISCAN (run) | 0100 | XXXX | 0000 | 00 | X | X |
| IREG | 0010 | XXXX | XXXX | 00 | X | X |
| CHPRST | XXXX | XXXX | XXXX | 10 | X | X |
| CHPTRIST | XXXX | XXXX | XXXX | 01 | X | X |

FIG. 12

CELL ARCHITECTURE FOR BUILT-IN SELF-TEST OF APPLICATION SPECIFIC INTEGRATED CIRCUITS

This application is a continuation under 37 C.F.R. § 1.62 of abandoned prior application Ser. No. 07/905,973 filed Jun. 29, 1992 for "A Cell Architecture for Built-In Self-Test of Application Specific Integrated Circuits."

BACKGROUND OF THE INVENTION

1. Field of the Invention

This invention relates generally to application specific integrated circuits (ASICs) and in particular to a single cell structure used for both boundary scan testing and built-in self-testing of ASIC logic during manufacturing testing.

2. Description of the Related Art

In an application specific integrated circuit (ASIC) there are two general problems encountered in the manufacturing testing process. The first problem is that the ASIC logic itself is defective and the second is that the circuitry used to get signals into the ASIC logic and out of the ASIC logic is defective. Consequently, test logic is built into an ASIC that is used only in the manufacturing process to verify the operability of the ASIC. After the manufacturing process is complete, the ASIC test circuitry is passive and is no longer required or used.

Typically, the ASIC built-in test logic includes a built-in self-test (BIST) capability as well as a boundary scan capability. For a boundary scan capability, boundary scan register cells (BSRCs) are placed between all the ASIC pins, that are used either as data input or data output pins, and the ASIC logic. Here, "data input pins" refers to the pins that provide input signals to the ASIC logic and "data output pins" refers to the pins that receive output signals from the ASIC logic.

The BRSCs may be used for a variety of manufacturing tests because the BRSCs provide direct control of all the data input pins and all the data output pins independent of the ASIC logic. The IEEE has evolved IEEE 1149.1 standard for boundary scan.

Built-in self-test (BIST) refers to any test circuitry which permits the ASIC to test itself. The advantages of BIST are that no special test patterns or test equipment are required and the ASIC can be tested independent of its environment.

There are many types of BIST. One type of BIST uses a pseudo-random number generator (PRNG) to drive each input line to the ASIC logic. Each PRNG creates a non-repeating, predictable, pseudo-random pattern on the input line that the PRNG drives. As the ASIC logic is clocked, these patterns propagate through the ASIC logic to the output lines of the ASIC, where a pseudo-random number signature analyzer (PRSA) is located. The PRSA is similar to a PRNG in that for any finite set of input signals to the PRSA, the PRSA creates a "signature" bit-pattern. While the signal pattern presented to the PRSA changes with each clock tick, the PRSA signature is based on the current and past input signals and thus represents a "history" of all previous patterns. By connecting the PRSA to an ASIC output line, a "history" of all previous ASIC output signals is generated. If any ASIC output line, at any clock cycle, has the wrong value, the signature generated by the PRSA differs from the signature generated by a PRSA in a known good device. By checking the signature of an ASIC under test against a signature from a known good ASIC tested under the same conditions, the functionality of the ASIC under test is determined.

ASIC 100 (FIG. 1) includes both built-in self-test capability and boundary scan capability for ASIC logic 110. The boundary scan capability is provided by input boundary scan register cells (BSRCs) 103-1 to 103-4, output boundary scan register cells 104-1 to 104-4, and test logic 120. The built-in self-test capability is provided by pseudo-random number generator cells 105-1 to 105-4, pseudo-random number signature analyzer cells 106-1 to 106-4, and test logic 120. ASIC 100 has four input pins 101-1 to 101-4 and four output pins 102-1 to 102-4.

As illustrated in FIG. 1, the configuration of the input and output boundary scan register cells 103-1 to 103-4 and 104-1 to 104-4 and pseudo-random number generator and signature analyzer cells 105-1 to 105-4 and 106-1 to 106-4 for each input pin and output pin is the same. Thus, the following description for input pin 101-2 and output pin 102-2 is applicable for any of the other input pins and output pins, respectively, of ASIC 100.

Input pin 101-2 drives an input boundary scan register cell 103-2 which in turn provides an input signal to pseudo-random number generator cell 105-2 that in turn drives an input line of ASIC logic 110. Similarly, a signal on an output line of ASIC logic 110 drives pseudo-random number signature analyzer cell 106-2. The output signal of cell 106-2 drives output boundary scan cell 104-2, which in turn drives output pin 102-2.

Test logic 120 drives control lines for the boundary scan cells, both input and output, and the pseudo-random number generator and signature analyzer cells. Typically, the built-in self-test and the boundary scan capability form an on-chip monitor architecture that conforms to IEEE 1149.1 standard. This standard requires that ASIC 100 have four additional pins, which are test data in signal pin TDI, test data out signal pin TDO, test mode select signal pin TMS, and test clock pin TCK. Test reset pin TRST* is an optional pin, but when test reset pin TRST* is used, the standard defines its use. In addition, most ASICs include, as illustrated for ASIC 100, an asynchronous ASIC reset pin RST and an asynchronous three-state output pin TRIST for use in normal operation of ASIC logic. However, for manufacturing tests, test logic 120 also typically includes a means for generating signals on lines TRISTATE and RESET to ASIC logic 110.

The built-in test circuitry may also include an internal scan capability in addition to the boundary scan and built-in self-test capabilities. For an internal scan of ASIC logic 110, input signals from pin TDI are passed through test logic 120 to ASIC logic 110 and the resulting signals from ASIC logic 110 are passed through test logic 120 to pin TDO. Test logic 120 generates a signal on line SS to configure flip-flops in ASIC logic 110 for the internal scan and in addition provides a clock signal on line CLK for the scan.

A typical structure for an input boundary scan register cell 203 and a typical structure for an output boundary scan register cell 304 are illustrated in FIGS. 2 and 3, respectively. Input boundary scan register cells 103-1 to 103-4 are identical and are represented by cell 203 (FIG. 2). Output boundary scan register cells 104-1 to 104-4 are also identical and are represented by cell 304 (FIG. 3). Moreover, the basic structure of cell 203 and cell 304 is the same. The only difference in cells 203 and 304 is the source of the input signal for the cell and the use of the output signal from the cell.

Each cell 203, 304 includes two two-to-one multiplexers 211, 214 and 311, 314 and two D-type flip-flops 212, 213 and 312, 313. Test logic 120 drives five control lines which are used by cells 203, 304. If the signal on control line MODE is active, the input signal to cell 203, 304 is not simply passed through the cell. Rather, multiplexer 214, 314 passes the signal generated by D-type flip-flops 212, 213 and 312, 313 to the cell output line.

In normal operation of ASIC 100, cells 203 and 304 add two two-to-one multiplexers signal propagation time delays between the input and output pins of ASIC 100. This time delay is in addition to the time delay of ASIC logic 110.

In addition to the time delay, cells 203 and 304 increase the gate count of ASIC 100. The size of a logic section in ASIC 100 is measured by the number of "equivalent gates" required to build the logic section. Herein, the number of equivalent gates is the number of the two input NAND gates required to duplicate the function of the logic section. Using an equivalent gate count, different designs can be compared on an equal basis. Table 1 gives the equivalent gate count for one BSRC, either an input or an output BSRC.

TABLE 1

| Gate Type | # Equivalent Gates | # in Cell | Total # Equivalent Gates |
|---|---|---|---|
| 2 Input MUX | 3 | 2 | 6 |
| D Flip-Flop with Clear | 8 | 2 | 16 |
| Total equivalent gates in cell | | | 22 |

Thus, in view of Table 1, the boundary scan register cells require an additional 44 equivalent gates for each input pin-output pin pair. Alternatively, in general BSRC Gate Count=(# Input Pins)*22+(# Output Pins)*22

A typical structure for a pseudo-random number generator cell 405 and a typical structure for a pseudo-random number signature analyzer cell 506 are illustrated in FIGS. 4 and 5 respectively. Pseudo-random number generator cell 405 (FIG. 4) represents pseudo-random number generator cells 105-1 to 105-4 and pseudo-random number signature analyzer cell 506 (FIG. 5) represents pseudo-random number signature analyzer cells 106-1 to 106-4. Each cell 405, 506 includes an exclusive OR gate, 416, 516, a D-type flip-flop, 417, 517, and a two-to-one multiplexer 418, 518. Each cell 405, 506 receives three control signals from test logic 120. If signal TEST_MODE is active, the pseudo-random number built-in self-test feature is enabled.

One difference in cells 405 and 506 is the source of the input signal and the use of output signal of the cell. The other difference is the number of input lines to the exclusive OR gate.

In normal operation of ASIC 100, cells 405 and 506 add two two-to-one multiplexer signal propagation time delays between the input and output pins of ASIC 100. This time delay is in addition to the time delay of ASIC logic 110 and in addition to the time delay introduced by the boundary scan register cells. In addition to the time delay, cells 405 and 506 also increase the gate count of ASIC 100. Tables 2 and 3 give the gate count for one pseudo-random number generator cell and one pseudo-random number signature analyzer cell, respectively.

TABLE 2

| Gate Type | # Equivalent Gates | # in Cell | Total # Equivalent Gates |
|---|---|---|---|
| 2 Input MUX | 3 | 1 | 3 |
| D Flip-Flop with Clear | 8 | 1 | 8 |
| 2 input XOR | 4 | 1 | 4 |
| Total equivalent gates in cell | | | 15 |

TABLE 3

| Gate Type | # Equivalent Gates | # in Cell | Total # Equivalent Gates |
|---|---|---|---|
| 2 Input MUX | 3 | 1 | 3 |
| D Flip-Flop with Clear | 8 | 1 | 8 |
| 3 input XOR | 12 | 1 | 12 |
| Total equivalent gates in cell | | | 23 |

Thus, in view of Tables 2 and 3, the built-in self test capability introduces an additional 38 gates for each input pin-output pin pair. Alternatively, in general, BIST PRN Gate Count=(# Input Pins)*15+(# Output Pins)*23.

For ASIC 100, the total equivalent gate count for the boundary scan cells and built-in self-test cells is:

GATE COUNT=(# Input Pins)*37+(# Output Pins)*45.

Boundary scan and BIST, as discussed above, add both logic gates to ASIC 100 and a propagation delay for signals as the signals travel through the additional test circuitry. Both of these effects are detrimental to the ASIC performance and cost.

The physical size and cost of ASIC 100 is proportional to the number of gates in ASIC 100. Thus, adding test circuitry directly increases the physical size and component cost of ASIC 100. Frequently, design and cost restraints force some test circuitry to be omitted due to the additional size/cost requirements. This reduces the testability of ASIC 100 and increases the manufacturing cost of the product on a whole, as the overall ASIC testability is reduced.

Any test circuitry placed in series with ASIC logic 110 between an input pin and an output pin adds signal propagation delay time as the signals are routed through the additional test circuitry. This occurs even in normal ASIC operation. Unfortunately, as ASICs are used in higher speed systems, the time delay which the ASIC can tolerate and still operate properly diminishes. Only minimal additional time delays can be tolerated. In some cases, the time delays incurred by including both boundary scan and BIST, as discussed above, are too great and either the boundary scan or BIST functionality is omitted. This reduces the testability of the ASIC and increases the manufacturing cost of the product as a whole, because the overall ASIC testability is reduced.

SUMMARY OF THE INVENTION

In accordance with the principles of this invention, an input test cell and an output test cell both include a boundary scan test circuit and a built-in self-test circuit. Thus, a single cell structure provides both a boundary scan capability and a built-in self test capability for ASIC logic. The dual function input test cell of this invention is connected between an input pin of the ASIC and an input line of the ASIC logic. The dual function output test cell is connected between an output line of the ASIC logic and an output pin of the ASIC.

The input test cell of the invention has a signal propagation time delay for a signal that travels from the input pin to the ASIC logic input line equivalent to one two-to-one multiplexer signal propagation delay. Similarly, the output test cell has a signal propagation time delay for a signal that travels from the ASIC logic output line to the output pin equivalent to one two-to-one multiplexer signal propagation delay.

Hence, while both the input test cell and the output test cell of this invention have the capability of both built-in self test and boundary scan testing, the dual capability is achieved without incurring a signal propagation time delay for each capability. In the prior art built-in test cells, an additional signal propagation time delay was encountered for each test capability. An ASIC that includes the dual function test cells of this invention has improved speed performance in comparison to a prior art ASIC that included a first set of cells for boundary scan testing and a second set of cells for built-in self testing, but yet the ASIC with the test cells of this invention provides the same manufacturing testing capability.

Not only is the speed performance of the ASIC with the test cells of this invention enhanced over the prior art, but also the equivalent gate count for the test cells of this invention is less than the combined gate count for the boundary scan register cell and the built-in self-test cell of the prior art. Thus, the same manufacturing testing capability is provided at a reduced cost. More importantly, the reduced gate makes it possible to include full manufacturing test capability on higher density ASICs, which in turn reduces the cost of production by reducing failures that would normally be detected at a later time in the production cycle or perhaps only after use of the ASIC by a customer.

BRIEF DESCRIPTION OF THE DRAWINGS

FIG. 12 is a diagram of the signals generated by the instruction decode of FIG. 9 for various bits patterns in the instruction register.

DETAILED DESCRIPTION

Figure 1:
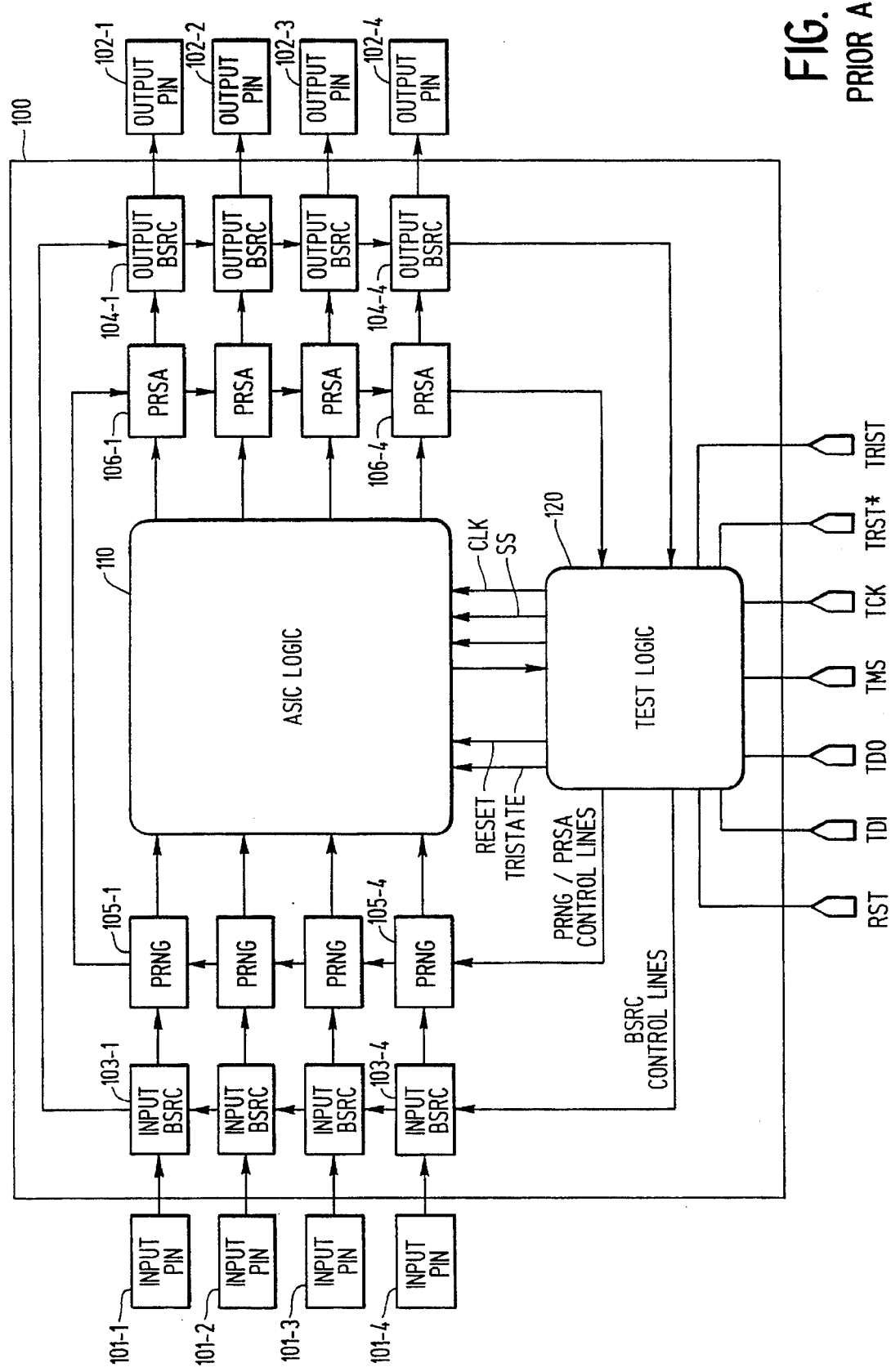
FIG. 1 is a block diagram of a prior art ASIC with input boundary scan register cells, output boundary scan register cells, pseudo-random number generator cells and pseudo-random number signature analyzer cells, along with test logic for built-in testing of the ASIC.
Figure 2:
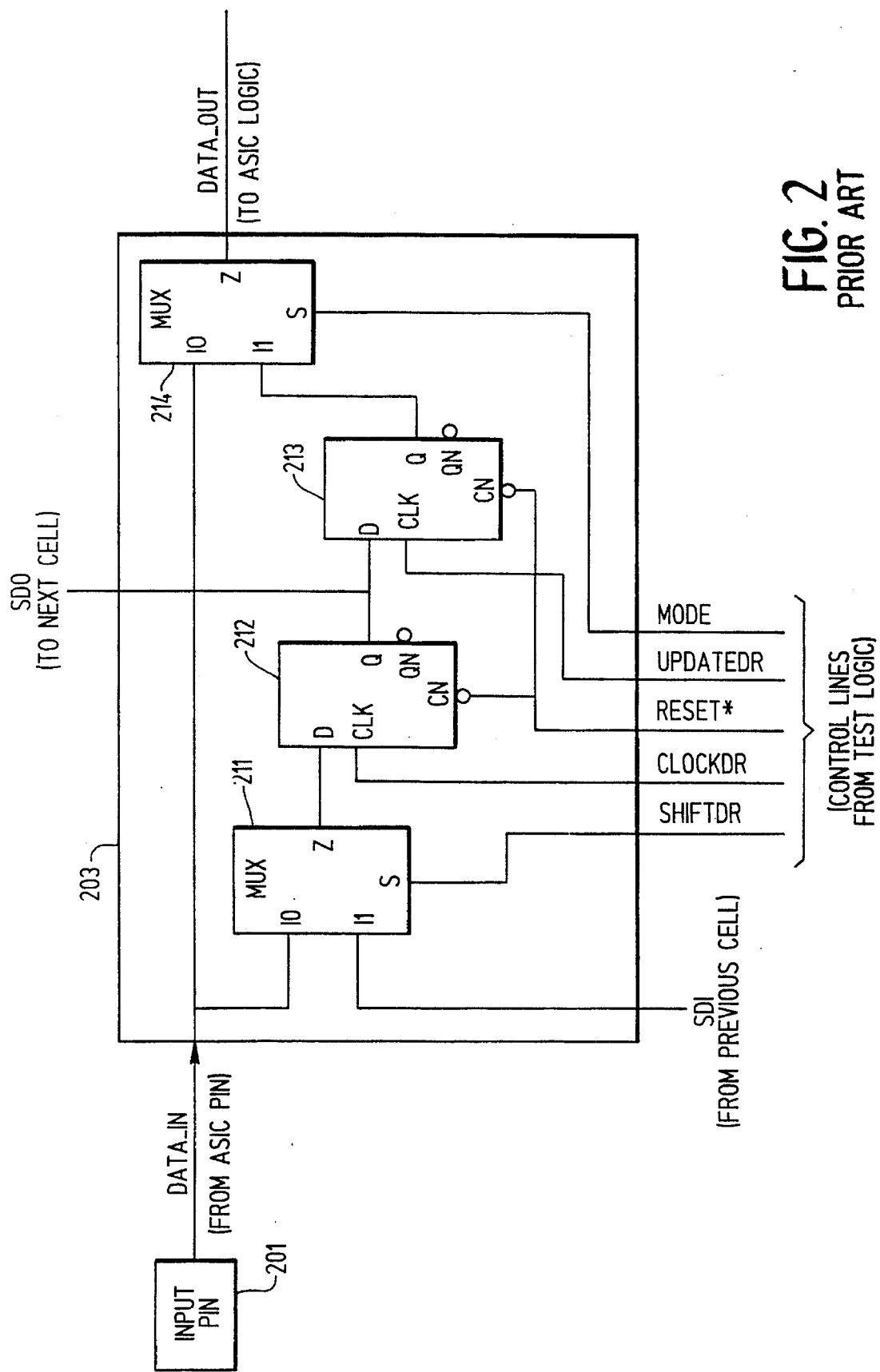
FIG. 2 is a schematic diagram of a prior art input boundary scan register cell.
Figure 3:
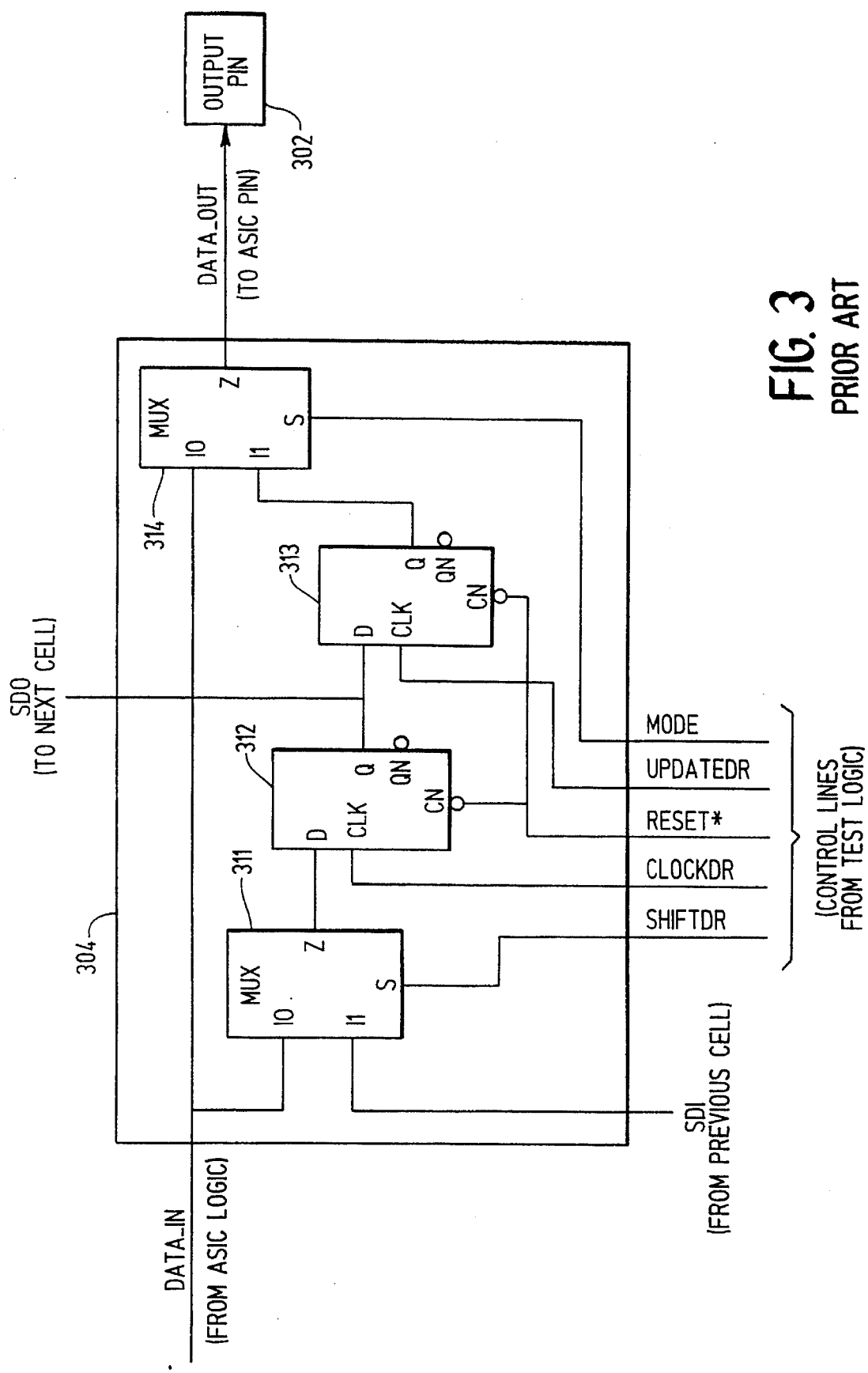
FIG. 3 is a schematic diagram of a prior art output boundary scan register cell.
Figure 4:
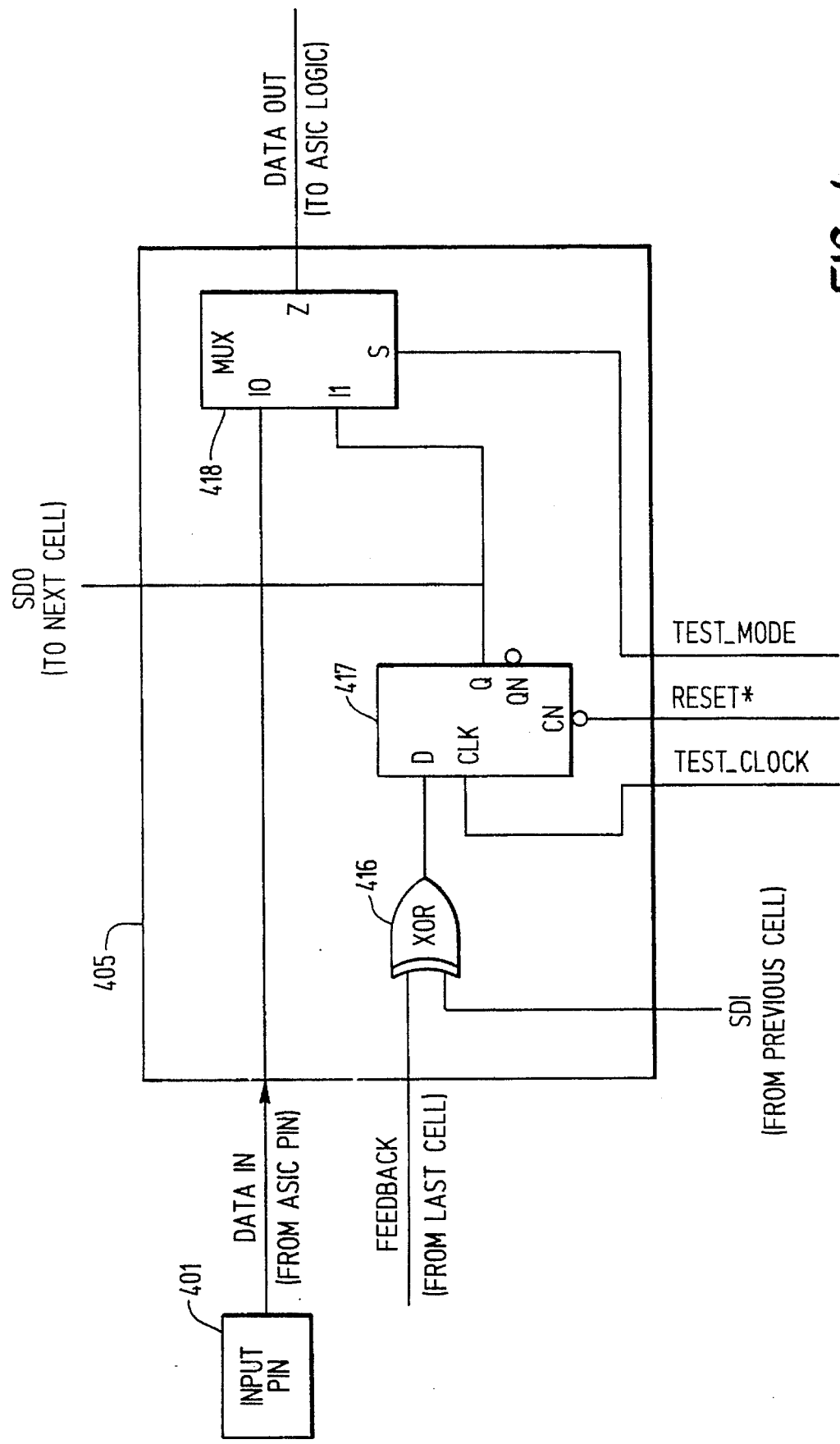
FIG. 4 is a schematic diagram of a prior art pseudo-random number generator cell.
Figure 5:
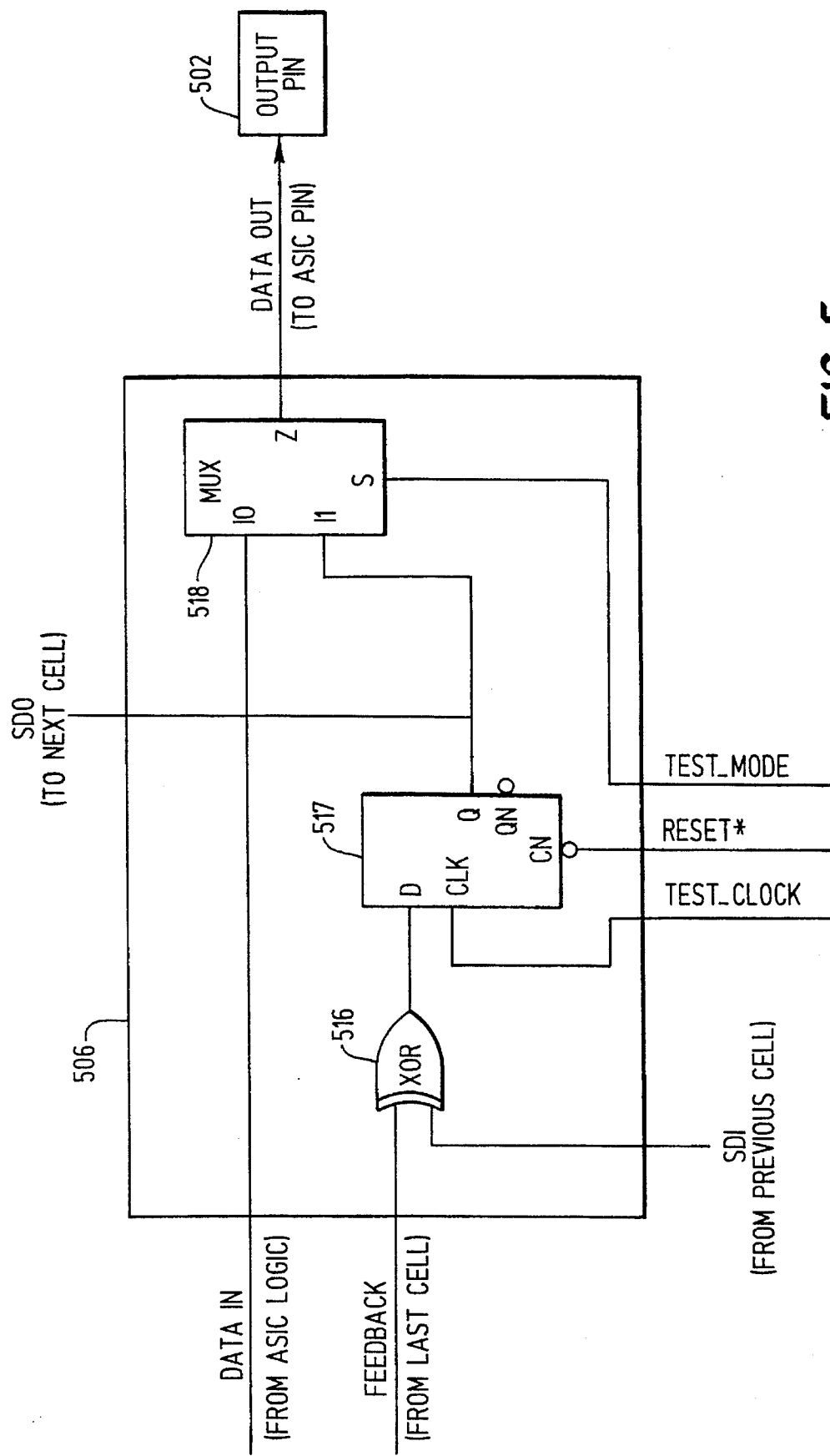
FIG. 5 is a schematic diagram of a prior art pseudo-random number signature analyzer cell.

In accordance with this invention, an application specific integrated circuit 600 (ASIC) includes ASIC logic 610, test logic 620 and novel test cells 603 and 604. Test logic 620 and novel test cells 603 and 604 provide manufacturing test capability for ASIC logic 610 with a plurality "s" of input pins 601 and a plurality "t" of output pins 602 while reducing both the gate count and signal time delay associated with test cells 603 and 604 in comparison to the prior art cells, described above.

In addition to the novel test cells 603 and 604, ASIC 600 preferably includes within test logic 620, a fail safe circuit 625, which is described more completely in copending, commonly assigned and commonly filed U.S. patent application Ser. No. 07/906,196 filed Jun. 29, 1992, entitled "FAIL SAFE, FAULT TOLERANT CIRCUIT FOR MANUFACTURING TEST LOGIC ON APPLICATION SPECIFIC INTEGRATED CIRCUITS," of Russell Gillenwater, et al., which is incorporated herein by reference in its entirety.

Fail safe circuit 625 generates a fail-safe output control signal, in response to an intermediate control signal from test logic circuitry 621, only during manufacturing testing when the fail-safe enable signal is applied to fail-safe circuit 625. Preferably, the fail-safe enable signal is provided on one of the plurality "u" of pins connected to test logic circuitry 621 so that the enable signal cannot be generated by a failure or defect in test logic 620.

Test cells 603 are a plurality of identical cells, preferably one test cell for each data input pin, that support both boundary scan and built-in self-test. Each input test cell includes a boundary scan circuit means and a built-in self-test circuit means and so herein each input test cell is referred to as "an input boundary scan register/built in self-test cell" (input BSR/BIST cell). Thus, the phrase "BSR/BIST cell" means that the single cell has both built-in self-test and boundary scan capability.

According to the principles of this invention, an input BSR/BIST cell has a signal propagation time delay for a signal, that travels from an input pin to an ASIC logic input line, equivalent to one two-to-one multiplexer signal propagation delay. Hence, while the input BSR/BIST cell of this invention has the capability of both built-in self-test and boundary scan testing, the dual capability is achieved without incurring a signal propagation time delay for each capability. In the prior art built-in test cells, an additional signal propagation time delay was encountered for each test capability.

Test cells 604 are a plurality of identical cells, preferably one test cell for each data output pin, that support both boundary scan and built-in self-test. Like the input BSR/BIST cell, each output BSR/BIST cell includes a boundary scan circuit means and a built-in self-test circuit means. According to the principles of this invention, an output BSR/BIST cell also has a signal propagation time delay for a signal, that travels from an ASIC logic output line to an output pin, equivalent to a single two-to-one multiplexer signal propagation delay. In the prior art output built-in test cells, an additional signal propagation time delay was encountered for each test capability.

Thus, ASIC 600 of this invention has improved speed performance in comparison to ASIC 100, but yet ASIC 600 provides the same manufacturing testing capability. Not only is the speed performance of ASIC 600 enhanced over the prior art, but also the equivalent gate count for the input and output BSR/BIST cells of this invention is less than the combined gate count for the corresponding boundary scan register cell and the built-in self-test cell of the prior art. Thus, the same manufacturing testing capability is provided at a reduced cost. More importantly, the reduced gate count makes it possible to include full manufacturing test capability on higher density ASICs, which in turn reduces the cost of production by reducing failures that would normally be detected at a later time in the production cycle or perhaps only after use of the ASIC by a customer.

Figure 6:
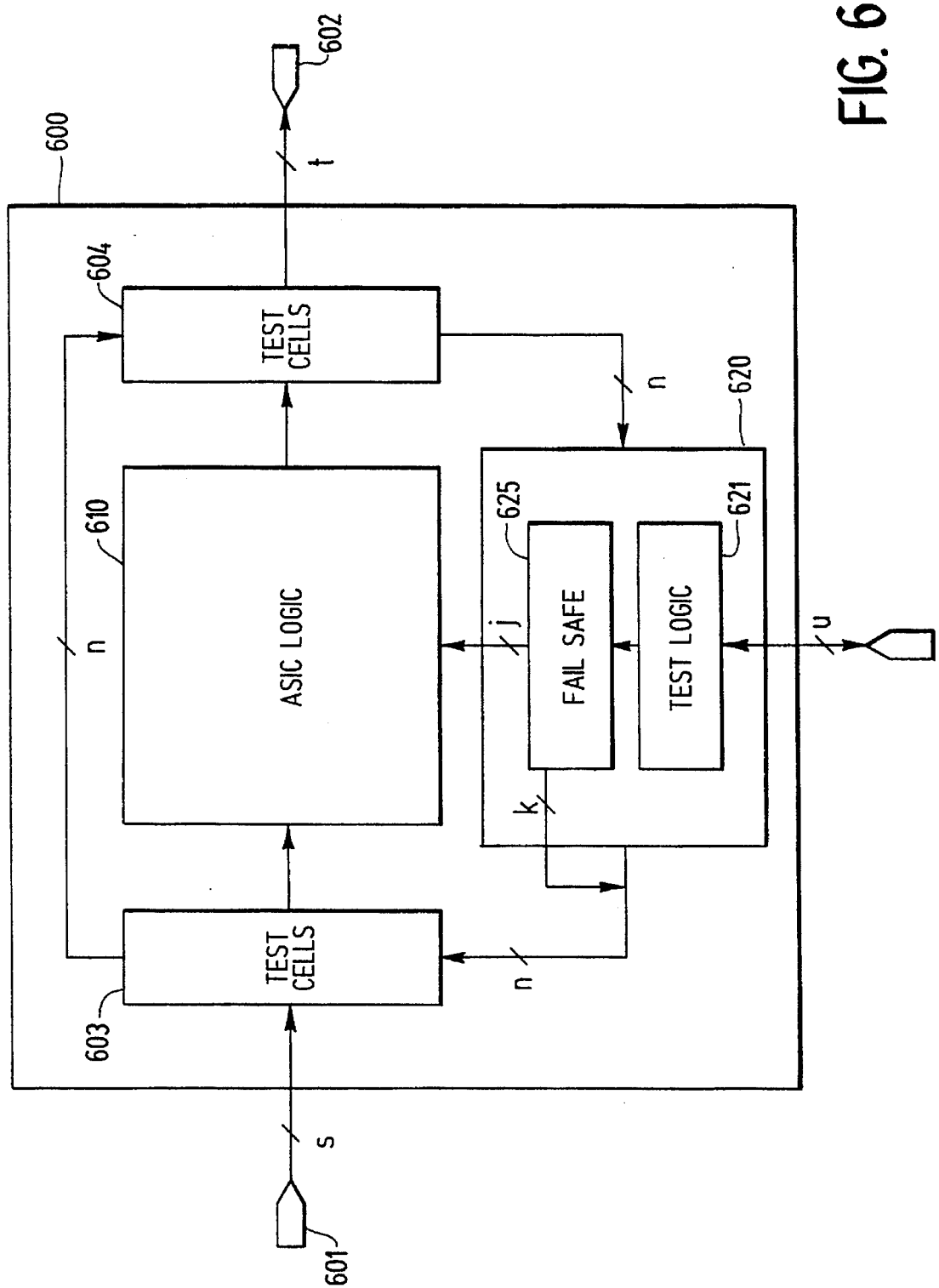
FIG. 6 is a block diagram of an ASIC that includes dual function input test cells and dual function output test cells according to the principles of this invention.
Figure 7:
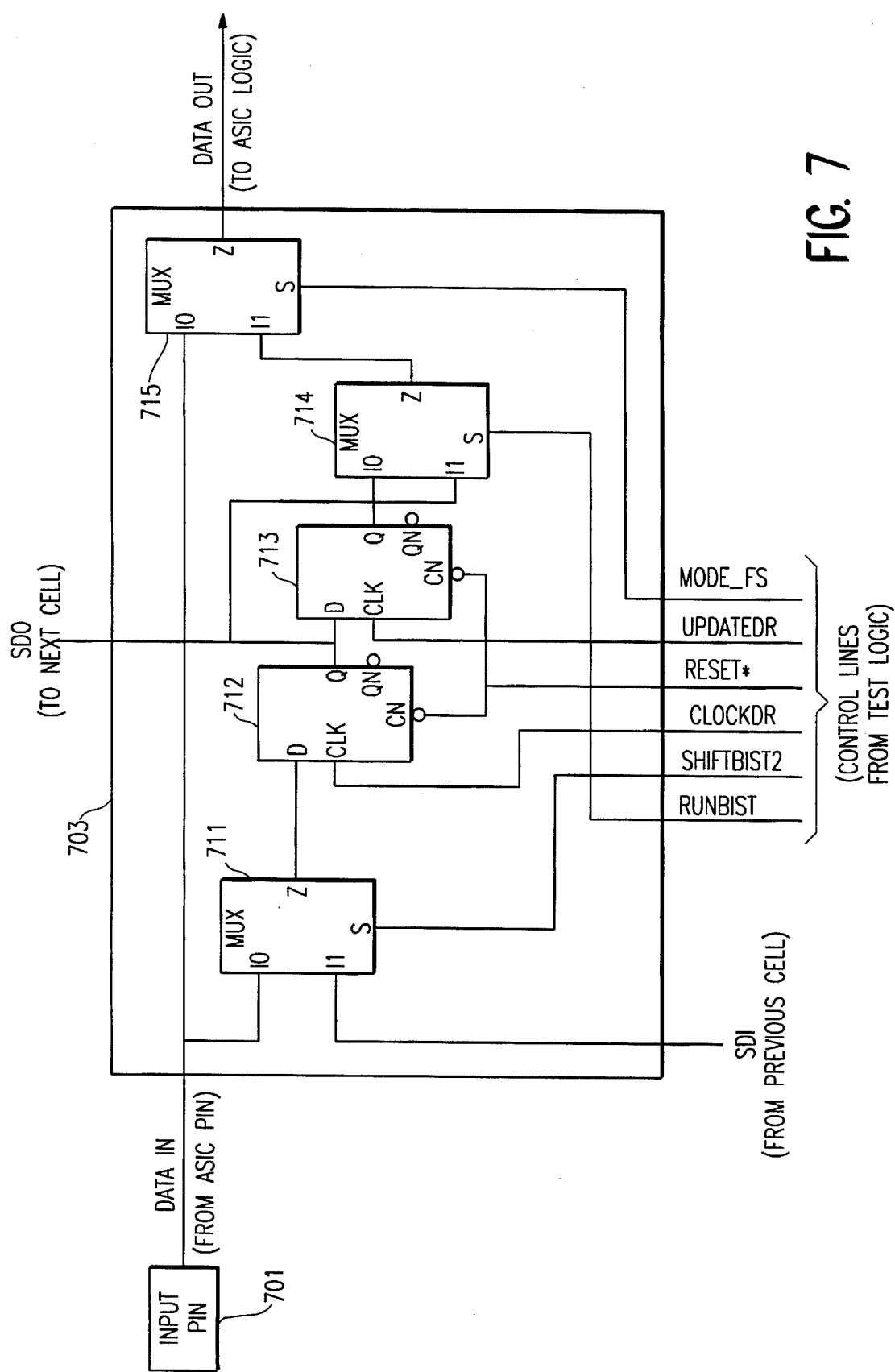
FIG. 7 is a schematic diagram of the input boundary scan register and built-in self-test cell of this invention.

One embodiment of an input boundary scan register cell with built-in self-test 703, referred to as an "input BSR/BIST cell", is illustrated in FIG. 7. A signal from input pin 701 is applied to a first input terminal of a first two-to-one multiplexer 711 and to a first input terminal of a second two-to-one multiplexer 715. The signal on a scan data in line SDI from the previous BSR/BIST cell is applied to a second input terminal of two-to-one multiplexer 711. The output signal of two-to-one multiplexer 711 to input terminal D of a first D-type flip-flop 712 is determined by the level on the signal on line SHIFTBIST2 from test logic circuitry 621 (FIG. 6). In this embodiment, if the signal on line SHIFT-BIST2 is inactive, e.g., low, the signal on the first input terminal of two-to-one multiplexer 711 is passed therethrough to D-type flip-flop 712 and conversely.

Clock terminal CLK of D-type flip-flop 712 is driven by the signal on line CLOCKDR from test logic circuitry 621 while the inverter on reset terminal CN is driven by the signal on line RESET* from test logic circuitry 621. The signal on output terminal Q of D-type flip-flop 712 drives input terminal D of a second D-type flip-flop 713 and shift data out line SDO which is connected to shift data in line of the next BSR/BIST cell.

Clock terminal CLK of D-type flip-flop 713 is driven by the signal on line UPDATEDR from test logic circuitry 621 while the inverter on reset terminal CN is driven by the signal on line RESET* from test logic circuitry 621. The signal on output terminal Q of D-type flip-flop 713 drives a first input terminal of a third two-to-one multiplexer 714.

The second input terminal of two-to-one multiplexer 714 is driven by the signal on scan data out line SDO. The output signal of two-to-one multiplexer 714 to a second input terminal of two-to-one multiplexer 715 is determined by the level on the signal on line RUNBIST from test logic circuitry 621 (FIG. 6). In this embodiment, if the signal on line RUNBIST is inactive, e.g., low, the signal on the first input terminal of two-to-one multiplexer 714 is passed therethrough to a second input terminal of two-to-one multiplexer 715 and conversely.

The output signal of two-to-one multiplexer 715 to an input line to ASIC logic 610 is determined by the level on the signal on line MODE_FS from fail-safe circuit 625 (FIG. 6). In this embodiment, if the signal on line MODE_FS is inactive, e.g., low, the signal on the first input terminal of two-to-one multiplexer 715 is passed therethrough to the input line of ASIC logic 610 and conversely.

Figure 8:
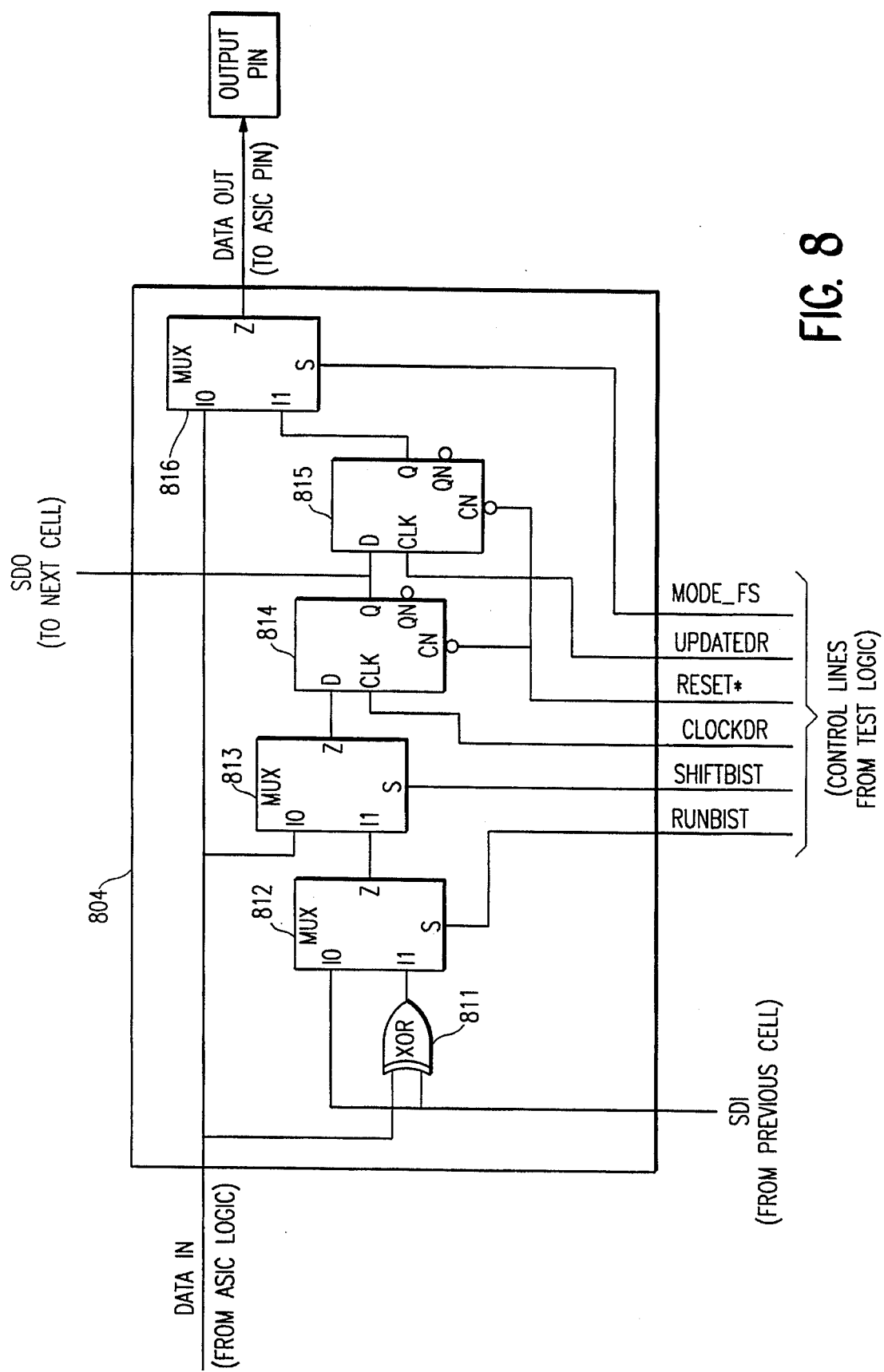
FIG. 8 is a schematic diagram of the output boundary scan register and built-in self-test cell of this invention.

One embodiment of an output boundary scan register cell 804 with built-in self-test capability, sometimes referred to as an "output BSR/BIST cell", is illustrated in FIG. 8. A signal from an output line of ASIC logic 610 (FIG. 6) is applied to a first input terminal of an exclusive OR gate 811 (FIG. 8), to a first input terminal of a first two-to-one multiplexer 813 and to a first input terminal of a second two-to-one multiplexer 816. The signal on a scan data in line SDI from the previous BSR/BIST cell is applied to a second input terminal of exclusive OR gate 811 and to a first input terminal of a third two-to-one multiplexer 812.

The output signal of exclusive OR gate 811 drives a second input terminal of two-to-one multiplexer 812. While in this embodiment an exclusive OR gate is used, exclusive OR gate is only representative of a logic gate that generates an output signal having a known logic state in response to a plurality of input signals with particular logic states. Thus, in view of this disclosure, one skilled in the art can implement output BSR/BIST cell 804 using a wide variety of logic gates or combinations of logic gates.

The output signal of two-to-one multiplexer 812 drives a second input terminal of two-to-one multiplexer 813. The output signal of two-to-one multiplexer 812 is determined by the level of the signal on line RUNBIST from test logic circuitry 621 (FIG. 6). In this embodiment, if the signal on line RUNBIST is inactive, e.g., low, the signal on the first input terminal of two-to-one multiplexer 812 from scan data in line SDI is passed therethrough to the second input terminal of two-to-one multiplexer 813.

The output signal of two-to-one multiplexer 813 is determined by the level of the signal on line SHIFTBIST from test logic circuitry 621 (FIG. 6). In this embodiment, if the signal on line SHIFTBIST is inactive, e.g., low, the signal on the first input terminal of two-to-one multiplexer 813 from the ASIC logic output line is passed therethrough to input terminal D of D-type flip-flop 814.

Clock terminal CLK of D-type flip-flop 814 is driven by the signal on line CLOCKDR from test logic circuitry 621 while the inverter on reset terminal CN is driven by the signal on line RESET* from test logic circuitry 621. The signal on output terminal Q of D-type flip-flop 814 drives input terminal D of a second D-type flip-flop 815 and shift data out line SDO which is connected to the shift data in line of the next output BSR/BIST cell.

Clock terminal CLK of D-type flip-flop 815 is driven by the signal on line UPDATEDR from test logic circuitry 621 while the inverter on reset terminal CN is driven by the signal on line RESET* from test logic circuitry 621. The signal on output terminal Q of D-type flip-flop 815 drives a second input terminal of two-to-one multiplexer 816.

The output signal of two-to-one multiplexer 816 to an output pin of ASIC 600 is determined by the level on the signal on line MODE_FS from fail-safe circuit 625 (FIG. 6). In this embodiment, if the signal on line MODE_FS is inactive, e.g., low, the signal on the first input terminal of two-to-one multiplexer 815 is passed therethrough to the input line of ASIC logic 610 and conversely. In one embodiment, cells 703 and 804 are implemented using one micron double metal CMOS technology.

Notice that both cell 703 and cell 804 of this invention have only a single two-to-one multiplexer 715, 816 positioned between the ASIC line and the associated pin. Thus, even though the cell supports both built-in self-test and boundary scan, as described more completely below, the total signal propagation delay introduced by the dual capability is only two two-to-one multiplexer delays in contrast to the four two-to-one multiplexer delays of the prior art configuration that included both boundary scan and built-in self-test capability for an input/output pin pair.

In addition to the improvement of the signal propagation delay, cell 703 and cell 804 reduce the equivalent gate count in comparison to the prior art cells and thereby make both boundary scan and built-in self-test possible on higher density ASICs.

Table 4 gives the equivalent gate count for cell 703.

TABLE 4

| Gate Type | # Equivalent Gates | # in Cell | Total # Equivalent Gates |
| --- | --- | --- | --- |
| 2 Input MUX | 3 | 3 | 9 |
| D Flip-Flop with Clear | 8 | 2 | 16 |
| Total equivalent gates in cell | | | 25 |

Table 5 gives the equivalent gate count for cell 804.

TABLE 5

| Gate Type | # Equivalent Gates | # in Cell | Total # Equivalent Gates |
| --- | --- | --- | --- |
| 2 Input MUX | 3 | 3 | 9 |
| D Flip-Flop with Clear | 8 | 2 | 16 |
| 2 Input XOR | 4 | 1 | 4 |
| Total equivalent gates in cell | | | 29 |

Thus, the total equivalent gate count associated with the BSR/BIST cells of this invention for each input pin-output pin pair is an additional 54 gates.

Thus, in general terms, the equivalent gate count for an ASIC with the BSR/BIST cells of this invention is:

Gate Count=(# Input Pins)*25+(# Output pins)*29

Thus, for prior art ASIC 100 with 60 input pins and 103 output pins, the boundary scan cells and the built-in self-test cells required 6855 gate equivalents (60*37+103*45). The BSR/BIST cells of this invention for the same number of pins require only 4487 gate equivalents (60*25+103*29). Thus, a total of 2368 equivalent gates or about 35% are saved by the BSR/BIST cells of this invention. If the total size of the ASIC was 47,700 equivalent gates, this savings represents a 5% savings in overall gate count. For ASICs with even larger numbers of input pins and output pins, the savings are even more substantial.

As explained below, this reduction in signal propagation delay and this reduction in equivalent gate count is achieved while maintaining the full capability for boundary scan testing and built-in self-testing. Thus, the cost of adding built-in test capability to an ASIC has been significantly reduced and the built-in test capability may be utilized without sacrificing capability of the ASIC logic.

Figure 9:
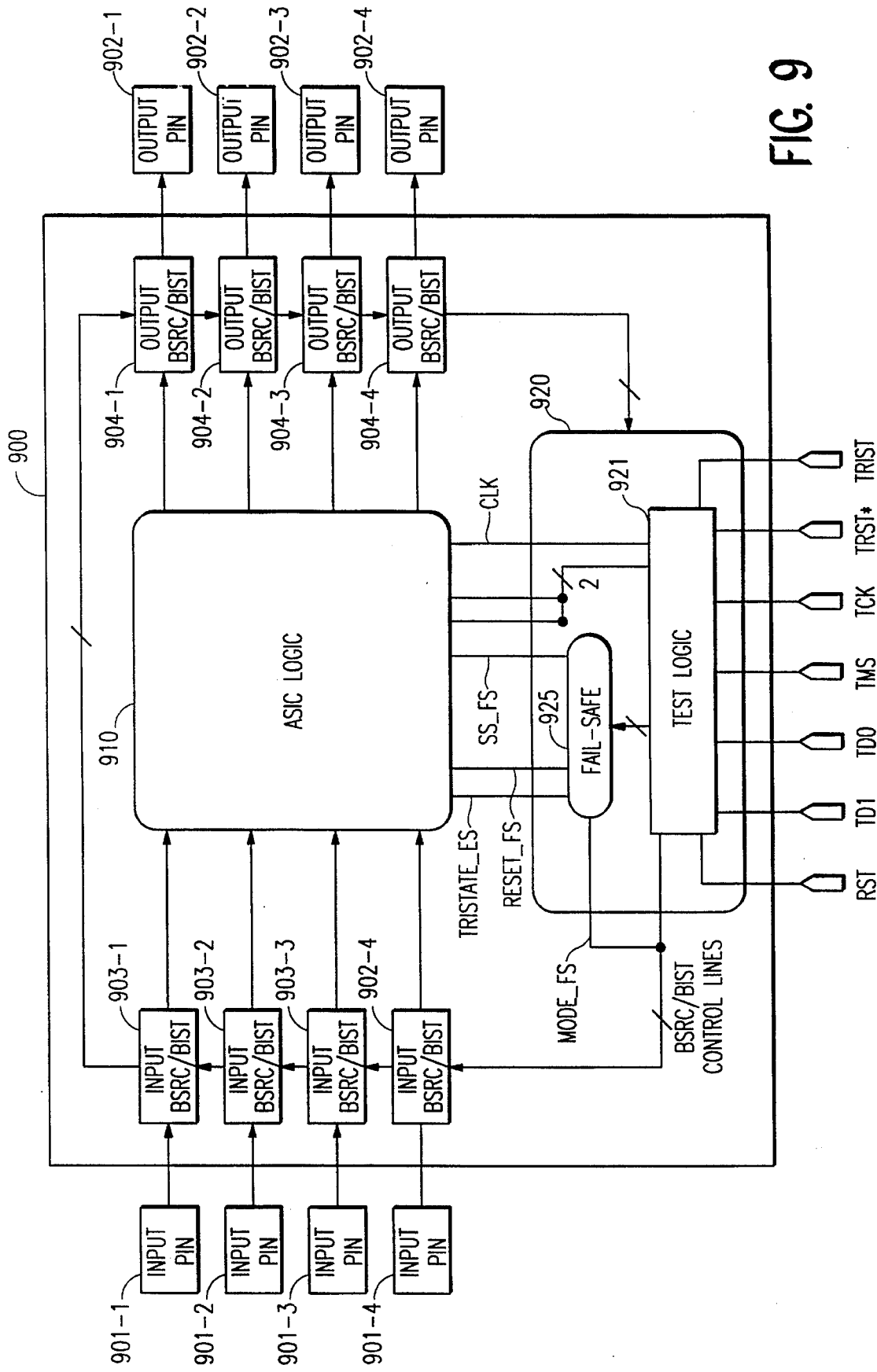
FIG. 9 is a more detailed block diagram of one embodiment of an ASIC that includes the input BSR/BIST cells and output BSR/BIST cells according to the principles of this invention.

A more detailed embodiment of this invention is illustrated in FIG. 9. Specifically, ASIC 900 includes ASIC logic 910, input pins 901-1 to 901-4, input BSR/BIST cells 903-1 to 903-4, output BSR/BIST cells 904-1 to 904-4, output pins 902-1 to 902-4, and pins RST, TDI, TDO, TMS, TCK, TRST*, and TRIST. Pins RST, TDI, TDO, TMS, TCK, TRST*, and TRIST are the same as those in prior art ASIC 100 as described above, and that description is incorporated herein by reference. Further, the operation and construction of fail-safe circuit 925 is described more completely in copending, commonly assigned and commonly filed U.S. patent application Ser. No. 07/906,196 filed Jun. 19, 1992, entitled "FAIL SAFE, FAULT TOLERANT CIRCUIT FOR MANUFACTURING TEST LOGIC ON APPLICATION SPECIFIC INTEGRATED CIRCUITS," of Russell Gillenwater, et al., which is incorporated herein by reference in its entirety. The number of input pins and output pins and the associated cells of this invention are illustrative only and are not intended to limit the invention to the number illustrated in FIG. 9.

Figure 10:
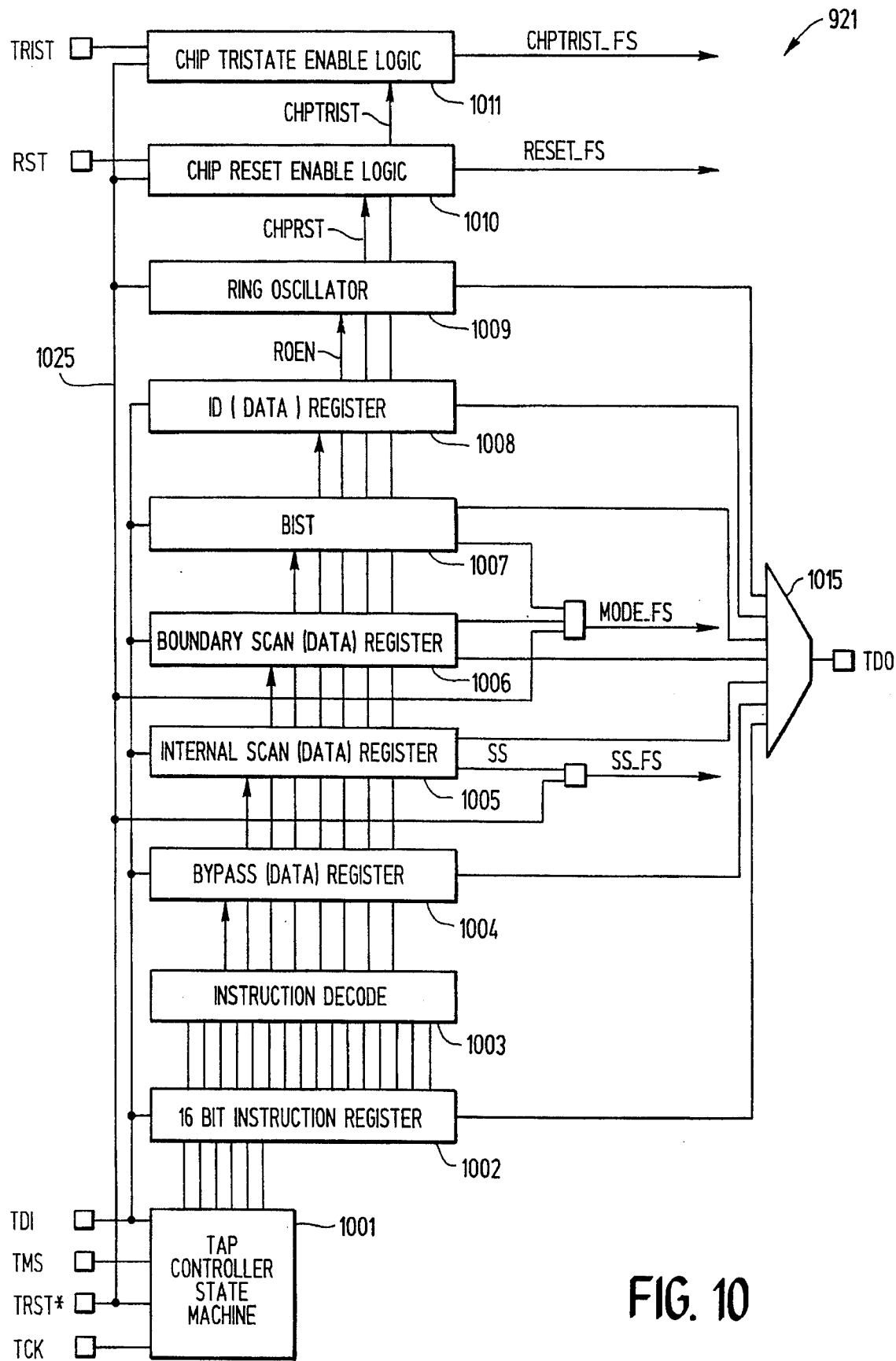
FIG. 10 is a block diagram of one embodiment of test logic circuitry suitable for use with the BSR/BIST cells of this invention.

A block diagram of the major components in test logic circuitry 921 is illustrated in FIG. 10. Pins TDI, TMS, TRST* and TCK are connected to TAP controller state machine 1001. As described more completely below, TAP controller state machine drives instruction registers 1002. The bits in instruction registers 1002 are decoded by instruction decode 1003. Instruction decode generates control signals for bypass data register 1004, internal scan data register 1005, boundary scan data register 1006, built-in self test 1007, ID data register 1008, ring oscillator 1009 as well as for chip reset enable logic 1010 and chip tristate enable logic 1011.

TAP controller state machine 1001 has three main portions, an idle state, an instruction register tree, and a data register tree. The instruction and data register trees provide the necessary synchronized signals to control all instruction and data registers in test logic circuitry 921. TAP controller state machine 1001 is implemented, in this embodiment, according to the IEEE 1149.1 standard. Specifically, TAP controller state machine 1001 receives serial test data input signals from pin TDI, a test mode select signal from pin TMS, a test clock signal from pin TCK, and asynchronous test reset signal from pin TRST*, which is also utilized as the fail safe circuit enable signal.

TAP controller state machine 1001 generates signals that include a shift enable signal for instruction register 1002, a clock signal for instruction register 1002, a parallel output latch enable signal for instruction register 1002, a shift enable signal for all data registers, a clock signal CLOCKDR for all data registers, a parallel output latch enable signal UPDATEDR for the data registers, and a reset signal RESET* for the instruction and data registers.

In this embodiment, instruction register 1002 is a sixteen bit register which is serially loaded from pin TDI under control of TAP controller state machine 1001. Each instruction register bit is implemented using the architecture recommended in the IEEE 1149.1 standard. The instructions are latched and presented in parallel to instruction decode instruction register 1003.

Instruction register 1002 receives the output signal from TAP controller state machine 1001 described above. Each bit is instruction register 1002 is latched and the latched bits drive a 16-bit bus. A serial data line connects bit 15 of instruction register 1002 to pin TDO through multiplexer 1015. This line permits serial scanning of data out of instruction register 1002 directly to pin TDO for testing instruction register 1002 for stuck-at faults. Upon reset, instruction register 1002 loads instruction BYPASS, as defined in the IEEE 1149.1 specification.

Figure 11:
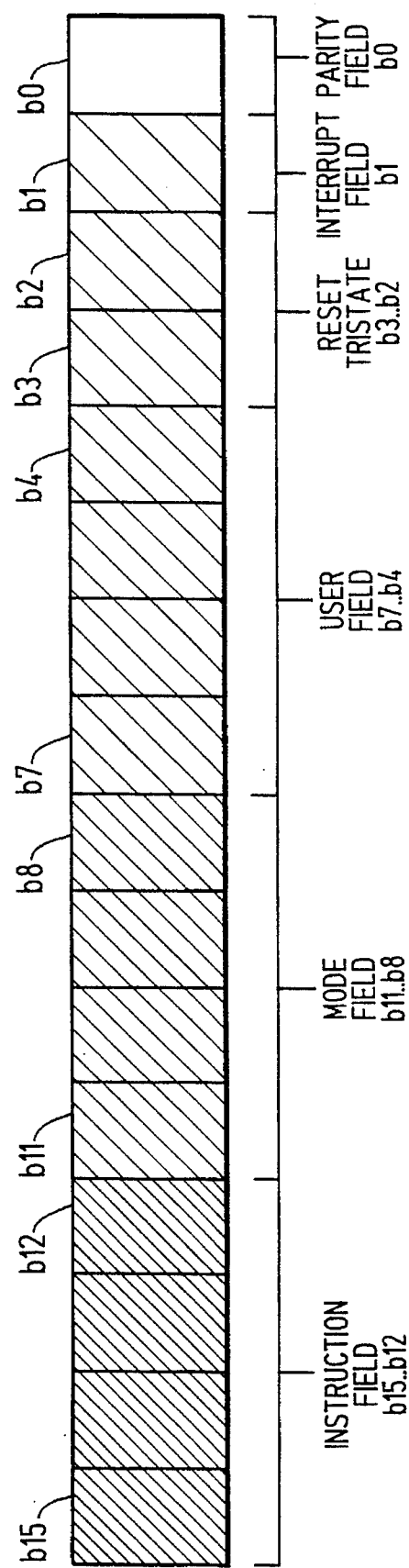
FIG. 11 is a diagram illustrating one embodiment of the assignments to bits b0–b15 of the instruction register of FIG. 10.

Instruction register 1002 is broken down into six fields, as shown in FIG. 11, which are from most significant bit (MSB) b15 to least significant bit (LSB) b0:

(1) instruction field bits b15 to b12 (4 bits);

(2) instruction mode field bits b11 to b8 (4 bits);

(3) instruction user option field bits b7 to b4 (4 bits);

(4) chip tristate/chip reset bits b3 and b2 (2 bits);

(5) interrupt bit b1—not used, (1 bit); and (6) parity bit b0—not used, (1 bit).

Of course, the placement of a particular field within the instruction register is a manner of choice and so the embodiment in FIG. 11 is illustrative of only one possible alignment of the fields. Similarly, the number of bits in the instruction register could be longer or shorter, e.g., 8 bits or 32 bits.

In manufacturing testing normal operation, instruction register 1002 is loaded by descending the TAP controller state machine instruction register tree. Upon entering the instruction register tree, the signal on the serial shift enable line is held low, and the instruction register clock line is pulsed once. This signal sequence loads a default hardwired value into instruction register 1002 (set to BYPASS).

If instruction register 1002 is exited at this point, the instruction register parallel output latch enable line is pulsed once, and the instruction is parallel latched at the output terminals of instruction register 1002. If a different instruction is desired, immediately after the first pulse on the instruction register clock line, the signal on serial shift enable line goes low, which in turn configures instruction register 1002 as a serial register. Sixteen pulses on the instruction register clock line are used to serially load a new instruction from pin TDI. After the sixteen clock pulses, a single pulse on the instruction register parallel output latch enable line latches the sixteen bit instruction on the parallel output terminals of instruction register 1002.

Instruction decode 1003 takes the latched instruction register parallel output signals and generates the necessary signals on the various control lines required for proper operation of test logic circuitry 921. Instruction decode 1003 receives the latched signals on the parallel output terminals of instruction register 1002 and the complement of these signals.

Instruction decode 1003 is fully asynchronous and decoded signals are available upon the bits of instruction register 1002 being latched on the parallel output terminals of instruction register 1002. One embodiment of the operations performed by instruction decode 1003 are given in FIG. 12. Each of the signals generated by instruction decode 1003 are described more completely below.

Bypass register 1004 (FIG. 10) is a data register that is required by the IEEE 1149.1 standard. Bypass register 1004 provides a connection between pin TDI and pin TDO with a time delay equal to one clock cycle on pin TCK. Bypass register 1004 receives the data register signals from TAP controller state machine 1001 described above.

To use bypass register 1004, instruction BYPASS is first loaded into instruction register 1002 via the TAP controller instruction register tree. Instruction BYPASS sets output multiplexer 1015 so that the output signal from bypass register 1004 is passed through output multiplexer 1015 to pin TDO. Next, the TAP controller data register tree is descended and the signal on data register shift enable line goes high which in turn routes the data on pin TDI to bypass register 1004. This data is then clocked through output multiplexer 1015 to pin TDO each time a pulse is generated on the data register clock line by TAP controller state machine 1001. Bypass register 1004 is used to bypass an ASIC in a serial chain of ASICs during a serial data transfer between the serial chain of ASICs.

ID data register 1008 is, in this embodiment, a 32 bit data register which provides a hardwired binary code that is unique to each individual ASIC. Register 1008 is implemented in accordance with the IEEE 1149.1 standard.

In manufacturing testing normal operation instruction register 1002 is first loaded with the instruction via the TAP controller instruction register tree to set output multiplexer 1015 to pass therethrough the least significant bit of ID register 1008. Next, the TAP controller data register tree is used to provide a single pulse on the data register clock line while the signal on the data register shift enable line is low. This signal sequence loads the hardwired ID code into ID register 1008. Next, the signal on data shift register enable line goes high, reconfiguring ID register 1008 into a serial register. The value of the LSB of ID register 1008 is immediately available at pin TDO. The remainder of the ID bits are clocked out by supplying 31 more clock pulses on the data register clock line.

Ring oscillator 1009 is a multiple inverter stage, e.g., 101 stage, 500 kHz, divide by "x" ring in this embodiment only. In this embodiment, "x" is sixty-four During normal ASIC operation and manufacturing testing, the high frequency, internal loop of ring oscillator 1009 is disabled to reduce power consumption and on-chip noise. Ring oscillator 1009 looks much like a data register, except ring oscillator 1009 has no need for the control data lines from TAP controller state machine 1001. Instead, ring oscillator 1009 is controlled solely by a decoded ring oscillator enable signal ROEN from instruction decode 1003. In this embodiment, the portion of fail-safe circuit 925 for ring oscillator 1009 is included within ring oscillator 1009.

In manufacturing testing normal operation, the TAP controller instruction register tree is descended and the ring oscillator instruction loaded and parallel latched in instruction register 1002. Immediately following the instruction latch, the ring oscillator internal loop is asynchronously enabled and the low frequency output signal passed through output multiplexer 1015 to pin TDO.

Figure 13:
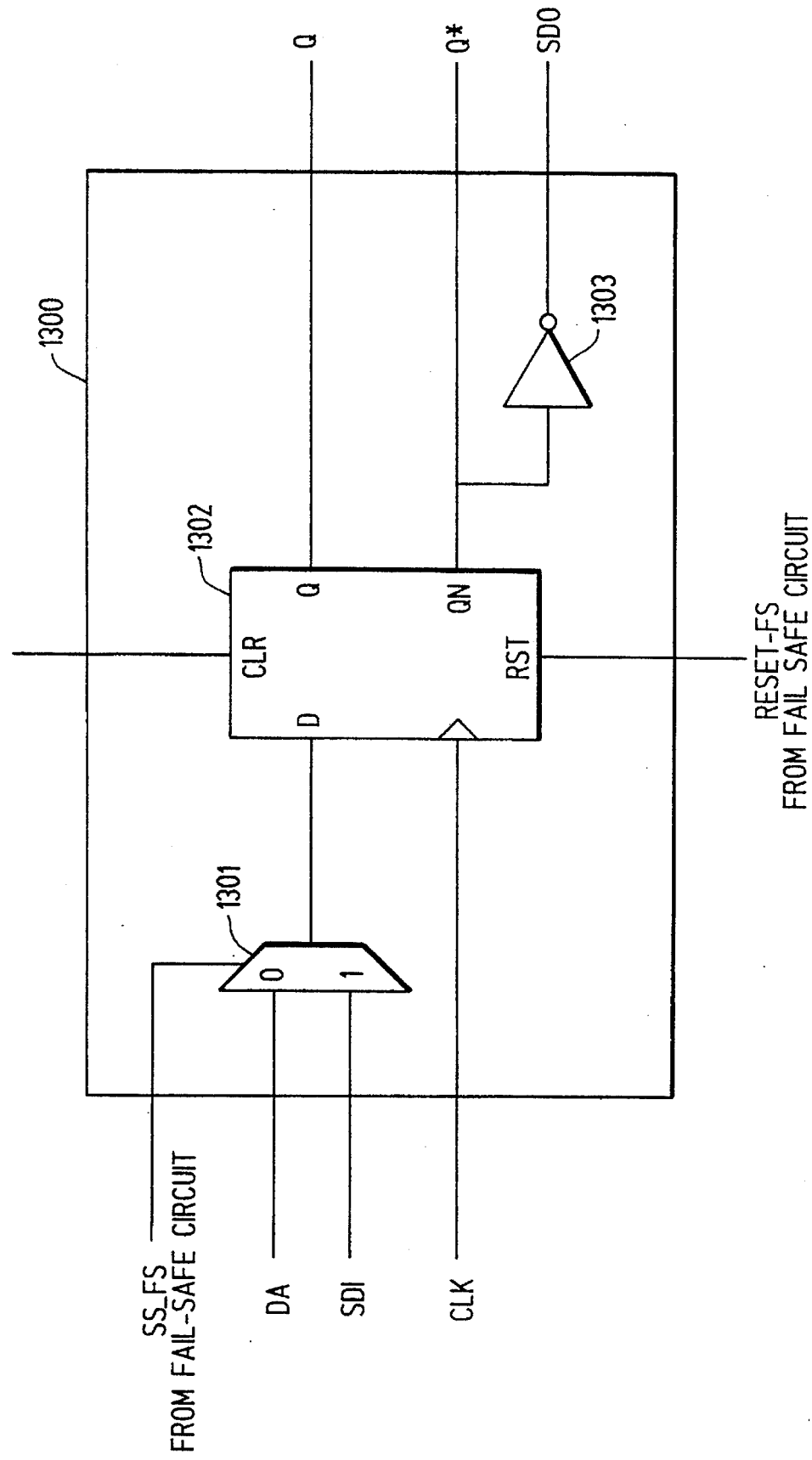
FIG. 13 is a structure within ASIC 900 that is controlled by signals from the fail-safe circuit so that the manufacturing test internal scan capability and reset capability are fault tolerant.

The internal scan capability is supported with all flip-flops in ASIC logic 910 preferably connected in a chain. Internal scan flip-flops can be configured into either a single loop or multiple loops. In this embodiment, structure 1300 of FIG. 13 is included with each flip-flop 1302 in ASIC logic 910. In another embodiment, inverter 1303 is omitted and scan data out line SDO is tied directly to output terminal Q of flip-flop 1302. The configuration shown is used to reduce loading on output terminal Q of flip-flop 1302 as this is typically a critical net during routing. Structure 1300 includes a line SDI for receiving the serial data from the previous scan flip-flop in the chain; fail-safe scan select line SS_FS to configure structure 1300 to normal or scan orientation; a normal data in line DA; a clock line CLK; a fail safe reset line RESET_FS; a clear line; a normal output line Q; and a complement output line Q*; and a scan data out line SDO. Lines DA and SDI are input lines to two-to-one multiplexer 1301. The signal passed through multiplexer 1301 to the input terminal D of D-type flip-flop 1302 is determined by the signal on fail-safe scan select line SS_FS.

For an internal scan, ASIC 900 is brought to a known state (probably via reset) and the ASIC logic clock is disabled. Instruction ISCAN(load mode) is loaded via the TAP controller instruction register tree into instruction register 1002 and the scan chain output signal is selected and passed through output multiplexer 1015 to pin TDO. Pin TDI is connected to the scan chain input line, and the signal on line SS goes active. However, the signal on line SS is applied to fail safe circuit element 925_SS, which drives fail-safe scan select line SS_FS. Fail safe circuit element 925_SS generates an active signal on line SS_FS only when the fail-safe enable signal on line 1025 is active and the signal on line SS is active. For the remainder of this discussion, it is assumed that the signal on line 1025 is active so that when signal SS goes active, signal SS_FS also goes active. When the signal on line SS_FS goes active, structure 1300 is configured for loading data.

Data are presented at pin TDI and the ASIC logic clock is now generated by the TAP controller CLOCKDR state which is used to load the data until the entire scan ring has been loaded. A new instruction, the internal scan (run mode), is then loaded into instruction register 1002 by TAP controller state machine 1001. This instruction is decoded and the signal on line SS_FS is driven low so that structure 1300 is in the normal mode. The ASIC logic clock is then clocked once via the TAP controller CLOCKDR state to propagate the loaded values through ASIC logic 910. The internal scan (load mode) instruction is once again loaded into instruction register 1001 and, as described above, structure 1300 is configured for scan operation. The sampled data is serially clocked out of the internal scan ring using the ASIC TAP controller CLOCKDR state.

In the built-in self-test using the BSR/BIST cells, referred to as "BSBIST", input BSR/BIST cells are configured as linear feedback shift registers (LFSRs) pseudo-random number generator cells and output BSR/BIST cells are configured as LFSR pseudo-random number signature analyzer cells.

Figure 14:
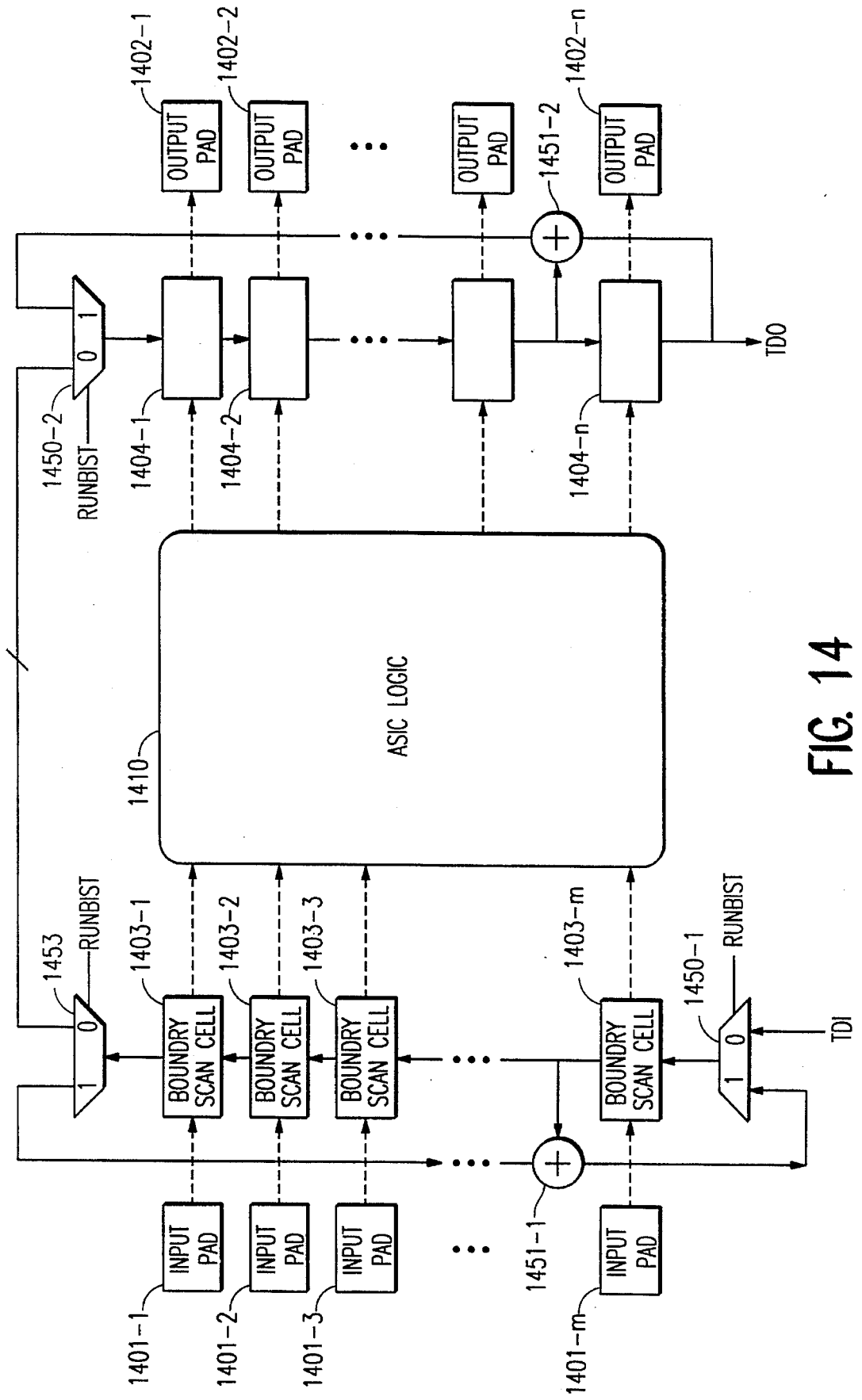
FIG. 14 is a block diagram illustrating the configuration of the input and output BSR/BIST cells of this invention for built-in self-testing.

The configuration for BSBIST is illustrated in FIG. 14. In addition to BSR/BIST input cells 1403-1 through 1403-m, a two input terminal Exclusive OR gates 1451-1, a 2:1 multiplexer 1450-1, and a two output decoder 1453 are included in the test circuitry. The position and configuration of the additional components that must be added to the built-in test circuitry are defined by the polynomial selected for the LFSR, as described more completely below. Such an implementation is apparent to anyone skilled in the art.

Similarly, for BSR/BIST output cells, 1404-1 to 1404-n, a two input terminal Exclusive OR gate 1451-2 and a 2:1 multiplexer 1450-2 are added to the test circuitry. These components are positioned to provide an implementation reflecting the polynomial selected for the LFSR described below. Such an implementation is apparent to anyone skilled in the art.

In an ASIC with 60 input pins and 103 output pins, there are 60 input BSR/BIST cells 703, and 103 output BSR/BIST cells 804. The 60 input BSR/BIST cells 703 are reconfigured into a polynomial of the order:

$$X^{60}+X^1+X^0.$$

The 103 output BSR/BIST cells 804 are reconfigured into a polynomial of the order:

$$X^{103}+X^9+X^0.$$

These polynomials were selected from Bardell, McAnney, and Savir, *Built-In Test for VLSI*, John Wiley & Sons, New York, N.Y., pp. 336–338, 1987 and represent primitive polynomials with the fewest number of terms.

In normal operation of the BSBIST, instruction PRELOAD is loaded into instruction register 1002 by descending the instruction register tree of TAP controller state machine 1001. During the serial loading of BSR/BIST input cell 703, signal SHIFTBIST2 is high, signal MODE_FS is low, and signal RUNBIST is low. In output BSR/BIST output cell 804, signal SHIFTBIST is high, signal MODE_FS is low, and signal RUNBIST is low. Here, "high" means that the signal is active.

Next, the data register tree is descended and the seeds for the pseudo-random number generator and the signature analyzer are clocked into input BSR/BIST cells 703 and 804 using TAP controller state machine 1001. During the serial loading of the data, a data bit is presented to pin TDI and a pulse on line CLOCKDR is generated by TAP controller state machine 1001 while the signals on the control lines to cells 703 and 804 are held in the conditions described above. Each pulse on line CLOCKDR loads on additional data bit and shifts the existing data through the BSR/BIST cell chain. (Prior to this, additional instructions PRELOAD and EXTEST could be executed to provide a fixed set of values at the ASIC output pins while the BSBIST is running. Similarly, the signal on line CHPTRIST_FS could be set to tristate all ASIC output pins during BSBIST operation).

Next, instruction BSBIST (run) is loaded into instruction register 1002 via the TAP controller instruction register tree to reconfigure input and output BSR/BIST cells 703 and 804 for the BSBIST (run) function. At this time in BSR/BIST input cell 703, signals RUNBIST, SHIFTBIST2, and MODE_FS remain active. In output BSRBIST cell 804, signals RUNBIST, SHFITBIST, and MODE_FS are also active.

Signal RUNBIST of cell 703,804 and in FIG. 14 is high when the BSBIST (run) instruction has been loaded into instruction register 1002 and decoded by instruction decode 1003. At all other times, signal RUNBIST is low.

Signal SHIFTBIST to output BSR/BIST cell 804 is generated by forming the logical OR of signals RUNBIST, SHIFTDR, and SAMPLEBIST. Signal SAMPLEBIST is active only when instruction BSBIST (sample) has been loaded into instruction register 1002 and decoded by instruction register 1003. At all other times, signal SAMPLEBIST is low. Signal SHIFTBIST2 to input BSR/BIST cell 703 is generated by forming the logical OR of signals RUNBIST and SHIFTDR.

After instruction BSBIST (run) is loaded, the data register tree is descended and pulses generated on line CLOCKDR for the number of times desired to clock ASIC logic 910. The clock signals on line CLOCKDR which is generated by TAP controller state machine 1001 in test logic 921 replaces the external system clock. After the appropriate number of pulses on line CLOCKDR, the data register tree in TAP controller state machine 1001 is descended to provide a signal on line UPDATER so that the BSBIST signature is latched into flip-flop 816 and is available at the ASIC output pins.

To serially remove the signature, instruction BSBIST (sample) is selected by descending the instruction register tree of the TAP controller state machine 1001. Next, the data register tree is descended and the serial results of the BSBIST are clocked out via state SHIFTDR of the TAP controller state machine.

In state SHIFTDR, the output BSR/BIST cell 804 has signal RUNBIST low, signal SHIFTBIST high, and signal MODE_FS high. As each pulse on line CLOCKDR is applied, the signature bit pattern is serially shifted from line SDI in device 804 through multiplexers 812 and 813, and latched in flip-flop 814 by clock CLOCKDR. In this function, all of the bits of the signature can be serially shifted out of the BSR/BIST cells through output mux 1015 to pin TDO. Again, if there are N BSR/BIST output cells comprising the signature, N–1 clocks are needed to extract the data as the first BSR/BIST cell value is immediately apparent at pin TDO after the instruction is entered.

The boundary scan capability is also implemented using test logic circuitry 921 (FIG. 9) with input BSR/BIST cells and output BSR/BIST cells. Both the input BSR/BIST cells and output BSR/BIST cells share a common signal bus, which includes the following lines: scan data in line SDI, which provides data from the previous BSR/BIST cell; fail safe line MODE_FS which carries the output two-to-one multiplexer control bit; line UPDATEDR, which carries the signal to parallel latch serial data in the BSR/BIST cell; reset line RESET*; clock line CLOCKDR for serial data shift in the BSR/BIST cell; line SHIFTDR, which carries the multiplexer control bit for BSR/BIST cell serial data shifting; line RUNBIST, which carries two-to-one multiplexer control bit; line SHIFTBIST2, which carries two-to-one multiplexer control bit for BSR/BIST input cell 703 line; SHIFTBIST which carries two-to-one multiplexer control bit for BSR/BIST output cell 804; and scan data out line SDO, which carries scan data to the next BSR/BIST cell.

These control lines are used in different configurations to provide several different operations utilizing BSR/BIST cells of this invention. The instructions loaded in instruction register 1002 to implement these different operations include instructions SAMPLE/PRELOAD, EXTEST, and INTEST, which are described more completely below.

Instruction SAMPLE/PRELOAD is used to either take a "snapshot" of the data at the pins of ASIC 900 (FIG. 9), (SAMPLE mode) or to serially preload data through BSR/BIST cells (FIGS. 7 and 8) without interfering with normal ASIC operation (PRELOAD mode). The SAMPLE/PRELOAD modes are fully described within the IEEE 1149.1 standard and are used to enter and retrieve data for instructions INTEST, EXTEST, and potentially BIST instructions.

In boundary scan testing, instruction SAMPLE/PRELOAD is executed by descending the instruction register tree in the TAP controller state machine 1001. After the instruction is latched in instruction register 1002 and decoded by instruction decode 1003, the BSR/BIST cells are reconfigured to permit serial data entry. Serial data entry is accomplished using the TAP controller data register tree to shift data via pin TDI into the BSR/BIST cells over lines SDI and SDO. Upon exiting the TAP controller data register tree, the BSR/BIST cells have been preloaded for the next instruction.

Instruction INTEST is used to present the data loaded into BSR/BIST cells via instruction PRELOAD to the input lines of ASIC logic 910, and is fully described within the IEEE 1149.1 standard. Thus, the signal on fail-safe lines MODE_FS is driven active, and the signal on RUNBIST is driven low so that multiplexers 714 and 715, pass the loaded data therethrough to the ASIC input line. Thus, immediately upon execution of instruction INTEST, all data in input BSR/BIST cell 703 are presented to ASIC logic. Consequently, instruction INTEST offers a means to present data vectors to ASIC logic.

Instruction EXTEST is similar in operation to instruction INTEST, but instruction EXTEST is used to present data to the ASIC output pins. Instruction EXTEST is also fully described in the IEEE 1149.1 standard. Data is first loaded in output BSR/BIST cells 804 using instruction PRELOAD. Next, the TAP controller instruction register tree is descended and upon latching instruction EXTEST in instruction register 1002 and decoding of that instruction by instruction decode 1003, output BSR/BIST cells 804 are reconfigured to present the preloaded data to the output pins of ASIC 600. Specifically, the signal on fail-safe line MODE_FS is driven active so that multiplexer 816 passes the loaded data therethrough to the ASIC output pin.

The embodiments described above of the dual function input test cell and the dual function output test cell are only illustrative of the principles of this invention and are not intended to limit the invention to the specific embodiments disclosed. In view of this disclosure, one skilled in the art will be able to implement both dual function test cells using a variety of components within the cells to achieve the functionality and performance described herein.

We claim:

1. A device comprising a cell including boundary scan testing circuit means and built-in self test circuit means, said cell having a boundary scan testing mode, a built-in self testing mode and a data pass through mode, each mode introducing a signal propagation time delay through said cell, the signal propagation time delay through said cell in said data pass through mode being substantially equal to the signal propagation time delay of a 2:1 multiplexer.

2. The device of claim 1 wherein said cell comprises an input cell.

3. The device of claim 1 further comprising a data input pin wherein said data input pin is connected to said cell.

4. The device of claim 3 wherein said cell further comprises:

first two-to-one multiplexer means having a first input terminal connected to said data input pin, a second input terminal, an output line, and a terminal for receiving a control bit;

second two-to-one multiplexer means having a first terminal connected to said data input pin, a second input terminal, an output line, and a terminal for receiving a control bit;

a scan data in line connected to the second input terminal of the first two-to-one multiplexer means;

first register means having an input terminal connected to the output line of the first two-to-one multiplexer means, a clock terminal, and an output terminal;

a shift data out line connected to the output terminal of the first register means;

second register means having an input terminal connected to the output line of the first register means, a clock terminal, and an output terminal;

third two-to-one multiplexer means having a first terminal connected to the output line of said second register means, a second input terminal connected to said scan data out line, an output line connected to said second input terminal of said first two-to-one multiplexer means, and a terminal for receiving a control bit.

5. The device of claim 1 wherein said cell comprises an output cell.

6. The device of claim 1 further comprising a data output pin wherein said data output pin is connected to said cell.

7. The device of claim 6 wherein said cell further comprises:

first two-to-one multiplexer means having a first terminal connected to a data in line, a second input terminal, an output line connected to said data output pin, and a terminal for receiving a control bit;

second two-to-one multiplexer means having a first terminal connected to said data in line, a second input terminal, an output line, and a terminal for receiving a control bit;

third two-to-one multiplexer means having a first terminal, a second input terminal, and an output line connected to said second input terminal of said second two-to-one multiplexer means, and a terminal for receiving a control bit;

a scan data in line connected to the first input terminal of the third two-to-one multiplexer means;

logic gate means having a first input terminal connected to said scan data in line, a second input terminal connected to said data in line, and an output line connected to the second input terminal of said third two-to-one multiplexer means;

first register means having an input terminal connected to the output line of the second two-to-one multiplexer, a clock terminal, and an output terminal;

a shift data out line connected to the output terminal of the first register means;

second register means having an input terminal connected to the output line of the first register means, a clock terminal, and an output terminal connected to the second input terminal of said first two-to-one multiplexer means.

8. The device of claim 7 wherein said logic gate comprises an Exclusive OR gate.

9. An integrated circuit having a plurality of pins, a logic circuit and a built-in test cell, said built-in test cell comprising:

boundary scan testing circuit means operatively connected to one of said pins and to said logic circuit; and built-in self testing circuit means operatively connected to said one of said pins and to said logic circuit, said test cell having a boundary scan testing mode, a built-in self testing mode and a data pass through mode, each mode introducing a signal propagation time delay through said test cell, wherein the inclusion of said built-in self-testing circuit means does not increase said signal propagation delay time of said built in test cell in the data pass through mode over said signal propagation delay time for said boundary scan testing circuit means in the data pass through mode.

10. An integrated circuit having a plurality of pins, a logic circuit and a built-in test cell as in claim 9 wherein said one pin is an input pin and said built-in test cell is an input built-in test cell.

11. An integrated circuit having a plurality of pins, a logic circuit, and a built-in test cell as in claim 10 wherein said boundary scan testing circuit means of said input built-in test cell further comprises:

first two-to-one multiplexer means having a first input terminal connected to said input pin, a second input terminal, an output line, and a terminal for receiving a control bit;

second two-to-one multiplexer means having a first terminal connected to said input pin, a second input terminal, an output line, and a terminal for receiving a control bit;

a scan data in line connected to the second input terminal of the first two-to-one multiplexer means;

first register means having an input terminal connected to the output line of the first two-to-one multiplexer means, a clock terminal, and an output terminal;

a shift data out line connected to the output terminal of the first register means;

second register means having an input terminal connected to the output line of the first register means, a clock terminal, and an output terminal; and third two-to-one multiplexer means having a first terminal connected to the output line of said second register means, a second input terminal connected to said scan data out line, an output line connected to said second input terminal of said first two-to-one multiplexer means, and a terminal for receiving a control bit.

12. An integrated circuit having a plurality of pins, a logic circuit and a built-in test cell as in claim 11 wherein said built-in self-testing circuit means of said input built-in test cell comprises:

said first two-to-one multiplexer;

said second two-to-one multiplexer;

said scan data in line;

said first register means;

said second register means;

said shift data out line; and said third two-to-one multiplexer wherein said components in said built-in self-testing circuit means are interconnected as in said boundary scan testing circuit means.

13. An integrated circuit having a plurality of pins, a logic circuit and a built-in test cell as in claim 9 wherein said pin is an output pin and said built-in test cell is an output built-in test cell.

14. An integrated circuit having a plurality of pins, a logic circuit and a built-in test cell as in claim 13 wherein said boundary scan testing means of said output built-in test cell further comprises:

a first two-to-one multiplexer having a first terminal connected to an output line of said logic circuit, a second input terminal, an output line, and a terminal for receiving a control bit;

a second two-to-one multiplexer having a first terminal connected to said output line of said logic circuit, a second input terminal, an output line, and a terminal for receiving a control bit;

a third two-to-one multiplexer having a first input terminal, a second input terminal, an output line connected to said second input terminal of said second two-to-one multiplexer, and a terminal for receiving a control bit;

a scan data in line connected to the first input terminal of the third two-to-one multiplexer;

a first register means having an input terminal connected to the output line of the second two-to-one multiplexer, a clock terminal, and an output terminal;

a second register means having an input terminal connected to the output line of the first register means, a clock terminal, and an output terminal connected to the second input terminal of said first two-to-one multiplexer;

a shift data out line connected to the output terminal of the first register means;

15. An integrated circuit having a plurality of pins, a logic circuit and a built-in test cell as in claim 14 wherein said built-in self-testing means of said input built-in test cell further comprises:

said first two-to-one multiplexer;

said second two-to-one multiplexer;

said scan data in line;

said first register means;

said second register means;

said shift data out line;

said third two-to-one multiplexer; and a logic gate having a first input terminal connected to said output line of said logic circuit, a second input terminal connected to said scan data in line and an output line connected to the second input terminal of said third two-to-one multiplexer.

16. An integrated circuit having a plurality of pins, a logic circuit and a built-in test cell as in claim 9 wherein said boundary scan testing circuit means and said built-in self-testing circuit means have a common set of control lines.

17. An integrated circuit having a plurality of pins and a logic circuit, comprising:

an input BSR/BIST cell, coupled between an input pin of the plurality of pins and the logic circuit, the input BSR/BIST cell including:

a first multiplexor, receiving data from the input pin and scan data from a previous cell, a first flip-flop, coupled to the first multiplexor and receiving an output of the first multiplexor and a first clock signal, a second flip-flop, coupled to the first flip-flop and receiving an output of the first flip-flop and a second clock signal, a second multiplexor, coupled to the second flip-flop and the first flip-flop and receiving an output of the second flip-flop and the output of the first flip-flop, and a third multiplexor, coupled to the input pin, the second multiplexor and the logic circuit, and receiving the data from the input pin and an output of the second multiplexor, and sending an output to the logic circuit.

18. The integrated circuit of claim 17, wherein the first multiplexor is controlled by a signal on an external control line.

19. The integrated circuit of claim 17, wherein the second multiplexor is controlled by a signal on an external control line indicating whether the cell is to perform a BIST function.

20. The integrated circuit of claim 17, wherein the third multiplexor is controlled by a signal on an external control line indicating whether the integrated circuit is in a pass-through mode.

21. An integrated circuit having a plurality of pins and a logic circuit, comprising:

an output BSR/BIST cell, coupled between the logic circuit and an output pin of the plurality of pins, the output BSR/BIST cell including:

a first multiplexor, receiving scan data from a previous cell and data from the logic circuit, a second multiplexor, coupled to the input pin and the first multiplexor and receiving and the data from the logic circuit and an output of the first multiplexor, a first flip-flop, coupled to the second multiplexor and receiving an output of the second multiplexor and a first clock signal, a second flip-flop, coupled to the first flip-flop and receiving an output of the first flip-flop and a second clock signal, and a third multiplexor, coupled to the logic circuit, the second flip-flop, and the output pin, and receiving the data from the logic circuit and an output of the third multiplexor and sending data to the output pin.

22. The integrated circuit of claim 19, wherein the first multiplexor is controlled by a signal on an external control line indicating whether the cell is performing a BIST function.

23. The integrated circuit of claim 19, wherein the second multiplexor is controlled by a signal on an external control line.

24. The integrated circuit of claim 19, wherein the third multiplexor is controlled by a signal on an external control line indicating whether the integrated circuit is in pass-through mode.

25. The integrated circuit of claim 19, wherein an exclusive OR element receives the data from the logic circuit and the scan data from the previous cell and sends an output of the exclusive OR element to a second input of the first multiplexor.

* * * * *